(12) United States Patent
Morsink et al.

(10) Patent No.: US 10,519,031 B2
(45) Date of Patent: Dec. 31, 2019

(54) ENCAPSULATIONS FOR MEMS SENSE ELEMENTS AND WIRE BONDS

(71) Applicant: Sensata Technologies, Inc., Attleboro, MA (US)

(72) Inventors: Frank Morsink, Aadorp (NL); Rijk Lorenzo, Enschede (NL)

(73) Assignee: Sensata Technologies, Inc., Attleboro, MA (US)

(*) Notice: Subject to any disclaimer, the term of this patent is extended or adjusted under 35 U.S.C. 154(b) by 0 days.

(21) Appl. No.: 15/809,368

(22) Filed: Nov. 10, 2017

(65) Prior Publication Data

US 2018/0134545 A1    May 17, 2018

(30) Foreign Application Priority Data

Nov. 11, 2016 (GB) .................................. 1619078.7

(51) Int. Cl.

| B81B 7/00 | (2006.01) |
|---|---|
| B81C 1/00 | (2006.01) |
| C08K 3/36 | (2006.01) |
| G01L 19/06 | (2006.01) |

(52) U.S. Cl.
CPC ........ B81B 7/0058 (2013.01); B81C 1/00333 (2013.01); C08K 3/36 (2013.01); G01L 19/0654 (2013.01); *B81B 2201/0264* (2013.01); *B81C 2203/0136* (2013.01); *C08K 2201/005* (2013.01); *C08K 2201/006* (2013.01); *C08K 2201/011* (2013.01)

(58) Field of Classification Search
CPC ................................ B81B 7/0032; C08K 3/36
See application file for complete search history.

(56) References Cited

U.S. PATENT DOCUMENTS

| 5,512,374 A  *  4/1996 | Wallace | ................ B81B 3/0005 |
|---|---|---|
| | | 310/309 |
| 2005/0104079 A1* 5/2005 | Kim | .................... H01L 51/5246 |
| | | 257/98 |
| 2007/0108463 A1* 5/2007 | Chua | ...................... H01L 33/56 |
| | | 257/100 |

(Continued)

FOREIGN PATENT DOCUMENTS

| DE | 102008012895 | 9/2009 | |
|---|---|---|---|
| WO | WO2012/123054 | 9/2012 | |
| WO | WO-2012123054 A1 * | 9/2012 | ......... G01L 19/0654 |

OTHER PUBLICATIONS

English Translation of WO2012123054A1 Provided by WIPO (Year: 2012).*

(Continued)

*Primary Examiner* — Stephen M Bradley
(74) *Attorney, Agent, or Firm* — Burns & Levinson LLP; George N. Chaclas; Janine M. Susan

(57) ABSTRACT

A MEMS sensor including a housing defining an interior and an inlet in fluid communication with an environment for sensing, a sensing die coupled to the housing for generating a signal based on the environment, an encapsulant is applied to the sensing die to protect the sensing die without interfering with the operation of the sensing die, characterized in that the encapsulant is a composition of a non-crosslinked substance having an organic backbone, and a silica thickener.

16 Claims, 6 Drawing Sheets

(56) References Cited

U.S. PATENT DOCUMENTS

| | | | |
|---|---|---|---|
| 2010/0105584 A1* | 4/2010 | Avataneo | C08F 214/182 |
| | | | 508/155 |
| 2012/0009438 A1* | 1/2012 | Dams | C08G 65/007 |
| | | | 428/704 |
| 2012/0291559 A1* | 11/2012 | Sterling | H01L 23/04 |
| | | | 73/723 |

OTHER PUBLICATIONS

UK Search Report for Application No. GB1619078.7 dated Mar. 8, 2017, 7 pages.

* cited by examiner

ENCAPSULATIONS FOR MEMS SENSE ELEMENTS AND WIRE BONDS

CROSS-REFERENCE TO RELATED APPLICATIONS

This application claims priority to GB Application No. 1619078.7, filed Nov. 11, 2016, which is incorporated herein by reference in its entirety for all purposes.

BACKGROUND OF THE INVENTION

1. Field of the Invention

The subject disclosure relates to protecting the components of MEMS and, in particular, MEMS sensing elements.

2. Background of the Related Art

Micro-electro-mechanical systems (MEMS) are used for a wide variety of applications. Many applications apply harsh operating environments to the MEMS. In many sensor applications, MEMS take the form of a semiconductor device having a semiconductor die on a substrate (aka sensor on a chip).

In order to function properly, the sensing element of the sensor-on-a-chip must be in the environment to be sensed. As a result, the sensing element (e.g., the die, wire bonds etc.) must be protected from the environmental factors such as humidity, dust, light, corrosion and the like. It has become difficult to protect the MEMS without interfering with operation thereof.

Any barrier on the MEMS can limit the device' performance and specifically sensitivity. For example, in the case when the barrier material has a high modulus of elasticity and shows very good adhesion to the sensor die and device packaging so as to limit the penetration of the water, steam etc. at the interface between the barrier and packaging, any mismatch in the Coefficient of Thermal Expansion (CTE) between the sensor die and the barrier creates unwanted stress and shift in the electrical parameters and hence reduces the accuracy of the sensor device. The barrier must therefore be selected carefully.

In pressure sensing applications, it is further complicated in that the MEMS must be exposed to pressure. Thus, hard epoxy and like materials cannot be used for protection. One attempt to overcome such difficulty is shown in Patent Cooperation Treaty Patent Application No. PCT/EP2012/000525 filed on Feb. 6, 2012 ('525 Application) published as WO 2012123054 A1 on Sep. 20, 2012, which discloses a sensor for an automobile exhaust. To protect the sensor, the '525 Application discloses coating a side of a membrane of the sensor with a non-crosslinked organic substance such as silicone-oil grease or perfluoropolyether (PFPE) oil fat. The '525 Application also discloses using a bodying agent in the coating of polytetrafluoroethylene (PTFE). Another typical approach is to use a PTFE-based gel such as Shin-Etsu SIFEL® available from Shin-Etsu Chemical Co., Ltd of Tokyo, Japan. SIFEL® is a cross-linked perfluoropolyether/silicone.

Further examples are disclosed in: U.S. Pat. No. 6,214,634 issued to Osajda et al. on Apr. 10, 2001; U.S. Pat. No. 7,216,545 issued to Uchida et al. on May 15, 2007; U.S. Pat. No. 7,096,739 issued to Kawamura et al. on Aug. 29, 2006; U.S. Pat. No. 7,725,268 issued to Appelo et al. on May 25, 2010; U.S. PGPUB No. 2010/0077862 to Benzel et al. published on Apr. 1, 2010; and German Application published as DE 102008012895 A1 on Sep. 10, 2009 by Lutz Mueller.

SUMMARY

A protective layer must be very effective in guarding against water in various forms to prevent failure. Acidic moisture is particularly pernicious. Further, under stressful engine conditions and temperature loading, degradation and swelling can lead to failure, lack of sensitivity, and/or poor performance. In view of the above, a need exists for an encapsulation of MEMS that cost effectively and robustly protects the sensing element, wire bonds and other components.

The present disclosure is directed to a MEMS sensor including a housing defining an interior and an inlet in fluid communication with an environment for sensing. A sensing die couples to the housing for generating a signal based on the environment. An encapsulant is applied to the sensing die to protect the sensing die without interfering with the operation of the sensing die, characterized in that the encapsulant is a non-crosslinked organic substance, i.e. a non-crosslinked substance having an organic backbone, and having a silica thickener. The encapsulant may be a non-crosslinked dispersion of a fluorinated organic substance. The encapsulant may also be at least 2% by weight of the silica thickener. In one embodiment, the encapsulant is a silica thickened perfluoropolyether (PFPE) oil. In another embodiment, the encapsulant includes high viscosity K-type PFPE oil (i.e., a branched PFPE with AMU>7000) and a blend of hydrophobic and hydrophilic silica (i.e., a 50:50 blend) which is approximately 5% silica by weight.

Still another embodiment of the present disclosure includes a method for making MEMS sensor including the steps of providing a housing defining an interior and an inlet in fluid communication with an environment for sensing, providing a sensing die coupled to the housing for generating a signal based on the environment, applying an encapsulant to the sensing die for protecting the sensing die without interfering with the operation of the sensing die, characterized in that the encapsulant is a non-crosslinked organic substance, i.e. a non-crosslinked substance having an organic backbone, and having a silica thickener. The method may further include the step of fabricating the encapsulant by thickening a perfluoropolyether (PFPE) oil to a semisolid by using microscopic particles of silica.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
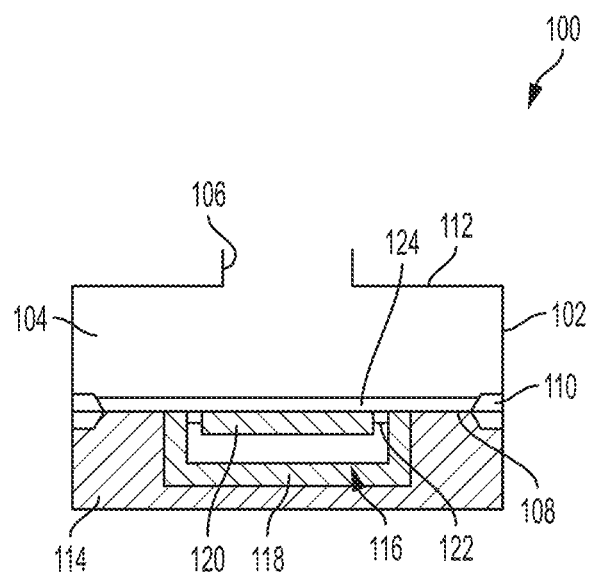
FIG. 1 is a schematic diagram of a MEMS sensor in accordance with the subject disclosure.

The subject technology overcomes many of the prior art problems associated with protecting the components of MEMS and, in particular, MEMS sensing elements. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left and the like are used with respect to the figures and not meant in a limiting manner.

Referring now to the FIG. 1, there is shown a schematic diagram of a MEMS sensor 100 in accordance with the subject disclosure. The MEMS sensor 100 may be for a variety of applications such as in automotive exhaust gas and the like. For example, the improved acid robustness and corrosion protection can handle significant pressure suitable for high pressure applications like sensing on the intake side of an engine (e.g., MAP sensor), pressure sensing in pneumatic brake applications, pressure sensing in high common mode pressure applications such as differential pressure sensing over EGR valves. Additional automotive applications can be oil vapor environments such as pressure sensing in engine crankcases or any oil environment as long as the oil in not one that interacts with the protective features. The MEMS sensor 100 includes a housing 102 defining an interior 104. The interior 104 is in fluid communication with the exhaust gases via an inlet 106. A membrane or diaphragm 108 is suspended within the interior 104 by mounts 110 to divide the housing 102 into an upper half 112 exposed to the exhaust gases and a lower half 114 that is substantially solid.

A sensing element or die 116 has a stationary component 118 coupled to the lower half 114 and a responsive component 120 coupled to the stationary component 118 by wire bonds 122. Changes in the interior result in corresponding changes in the electrical signal from the sensing die 116 so that accurate readings of the exhaust pressure can be determined. An encapsulant 124 is applied on top of the membrane 108 to protect the sensing die 116 without interfering with the operation of the sensing die 116. The encapsulant 124 may be a non-crosslinked organic substance, i.e. a non-crosslinked substance having an organic backbone, and having a silica thickener. In one embodiment, the encapsulant 124 is a non-crosslinked dispersion of a fluorinated organic substance and an inorganic substance. Preferably, the weight percentage of the inorganic substance is at least 2%.

In another embodiment, the encapsulant 124 is a silica thickened perfluoropolyether (PFPE) oil. The silica thickened perfluoropolyether (PFPE) oil is fabricated by thickening PFPE oil to a semisolid by using microscopic silica particles. Typically, only a small amount of silica particles are needed to create the desired semisolid. Both PFPE oil and silica particles are extremely stable, nonflammable, and chemically inert so that the resulting semisolid is only soluble in other fluorinated compounds. In one embodiment, the subject technology is applied to a pressure sensor as shown in U.S. Pat. No. 7,992,441 issued on Aug. 9, 2011 to Mulligan et al. ('992 patent).

In various embodiments, the perfluoropolyether (PFPE) is a compound of Formula I, a compound of Formula II, or a composition that is a blend of a compound of Formula I (a branched molecule) and a compound of Formula II (a linear molecule):

Formula I:

Formula I $m + n = 8\text{-}45;$
$m/n = 20\text{-}1{,}000$

Formula II $p + q = 40\text{-}180;$
$p/q = 0.5\text{-}2$

Formula II:
Suitable PFPE's of Formula I have an AMU>7000. A preferred PFPE of Formula I is YR1800, more preferred is an even heavier YR1800+ oil. Suitable PFPE's of Formula II have an AMU>18,000. Preferred PFPE's of Formula II are M100 and Z60.

| Properties | YR1800 | M100 | Z60 |
|---|---|---|---|
| Approximate ISO grade | 460 | 680 | 320 |
| Average molecular weight | 7,300 | 21,900 | 21,500 |
| Kinematic viscosity | | | |
| At 20° C. | 1,850 | 1,300 | 600 |
| At 40° C. | 510 | 700 | 355 |
| At 100° C. | 47 | 200 | 98 |
| Viscosity index | 148 | 384 | 350 |
| Pour point | −20 | −50 | −63 |
| Evaporation weight loss | | | |
| At 149° C., 22 hr | — | — | — |
| At 204° C., 22 hr | 0.5 | 0.3 | 0.2 |
| Surface tension at 20° C. | 24 | 25 | 25 |
| Density at 20° C. | 1.92 | 1.87 | 1.85 |
| Four ball wear test (at 75° C., 1 hr, 1,200 rpm, 40 kg) average scar diameter | 1.2 | — | 0.93 |

In various embodiments, where the PFPE composition is a blend of a compound of Formula I and a compound of Formula II, the weight % of Formula II per the total amount of PFPE may be up to 50%, preferably up to 40%, 30%, 20% or 10%. In alternative embodiments, the wt % of Formula II may be down to 0%. In some embodiments, 100 wt % of the total amount of PFPE is a compound of Formula I. In other embodiments, the weight % of Formula II may be 0%-50%.

Figure 6:
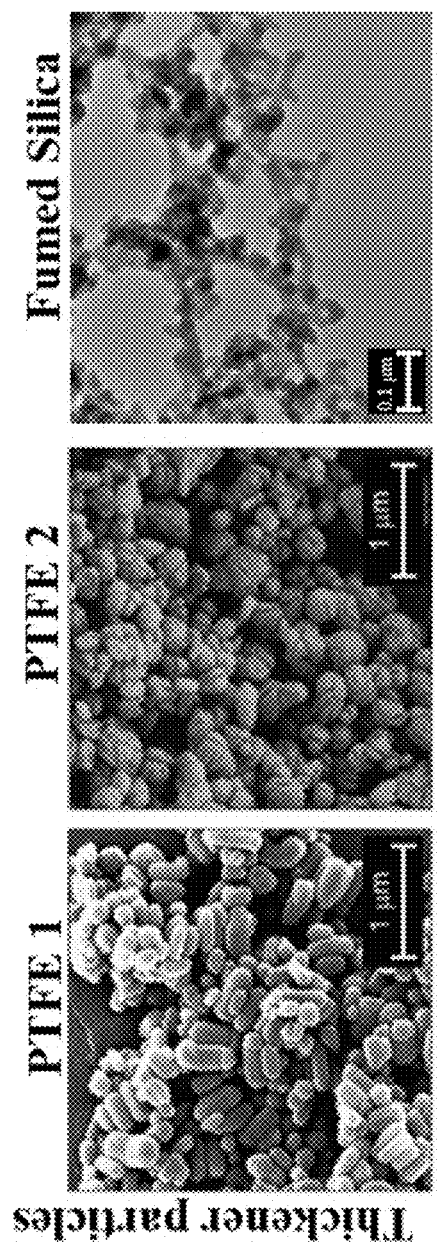
FIG. 6 is a series of photographs of particle thickeners; left and middle panels are PTFE not of the subject disclosure, and right panel is fumed silica in accordance with the subject disclosure.

In various embodiments, the silica is a blend of hydrophobic and hydrophilic silica. The ratio of hydrophobic:hydrophilic silica may be 50:50, preferably 60:40, 70:30, 80:20 or 90:10. In alternative embodiments, the portion of hydrophobic silica may be 70-100%, preferably up to 100%. In some embodiments, 100% hydrophobic silica (i.e., 100:0 ratio) is used in the encapsulant formulation. Whether using a blend of hydrophobic and hydrophilic silica or 100% hydrophobic silica, the amount of silica in the various embodiments of the encapsulant formulation may be about 2% to about 5% by weight. The silica used in the encapsulant formulations, according to the subject disclosure, has a particle size of about 5-50 nm (see FIG. 6). For comparison, organic PTFE (polytetrafluoroethylene) particles used in prior art formulations, are also shown in FIG. 6. The silica used in the encapsulant formulations, according to the subject disclosure, has a much higher surface area compared to organic PTFE particles. Attempts to use PTFE particles instead of silica in encapsulant formulations resulted in hysteresis and accuracy problems.

|  | Fumed silica | PTFE |
| --- | --- | --- |
| Primary particle size | 5-50 nm | 100-300 nm |
| Specific surface area | 50-600 m$^2$/g | 8-20 m$^2$/g |

The encapsulant formulations, according to the subject disclosure, of non-crosslinked organic substance, i.e. a non-crosslinked substance having an organic backbone, and having a silica thickener, provide increased robustness. In order to create an accurate low pressure sensor, a silica thickener is needed for reduced viscous loss in the material. Heavy PFPE oils (AMU>7000) are needed in the encapsulant formulations to pass vibration requirements.

Figure 2:
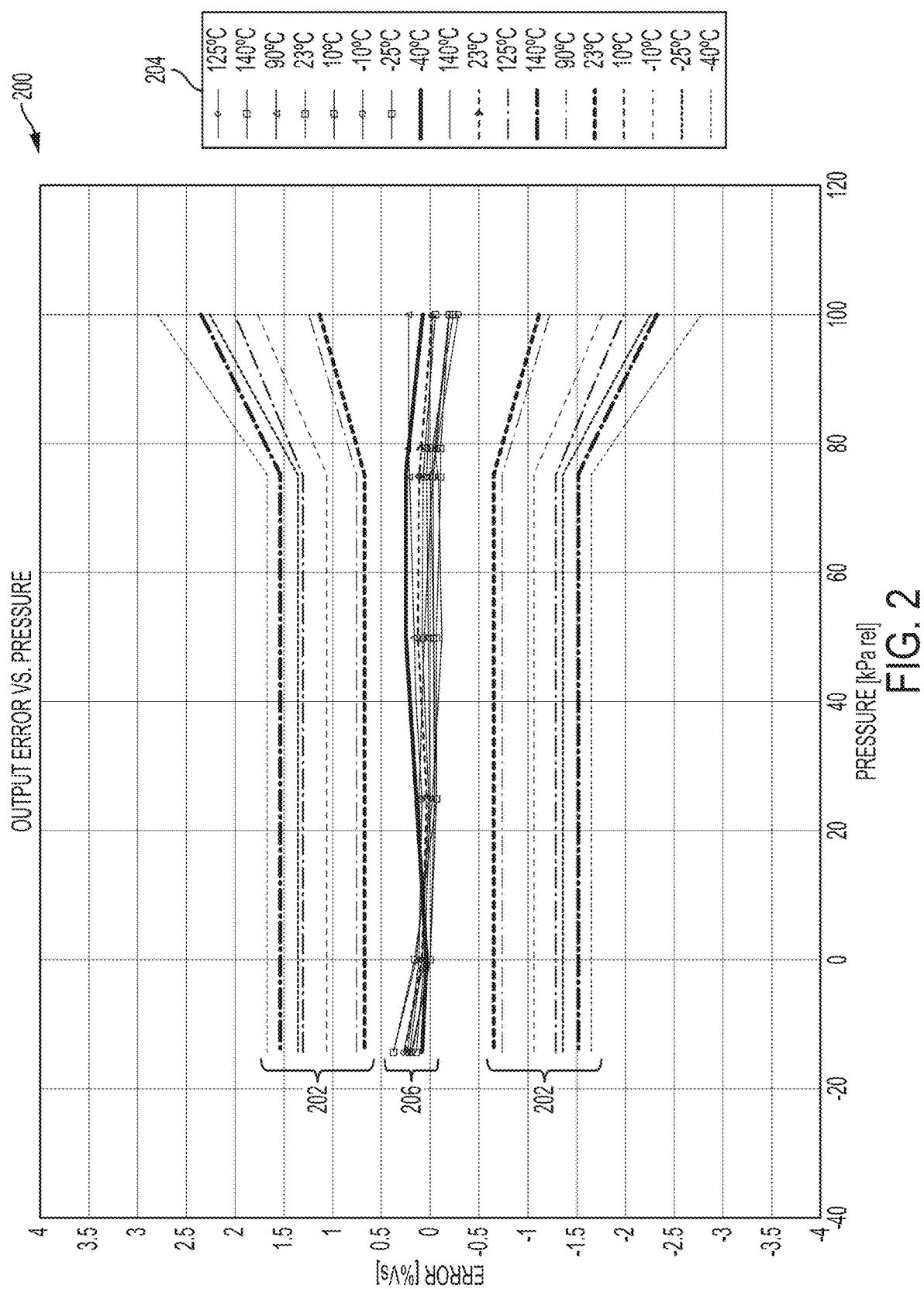
FIG. 2 is a graph of output error versus pressure for a MEMS sensor using a first encapsulant formulation in accordance with the subject disclosure.

Referring now to FIG. 2, a graph 200 of output error versus pressure for a MEMS sensor using a first encapsulant formulation in accordance with the subject disclosure is shown. Desirable specifications for various temperatures are shown on the graph 200 as limit lines 202, which can be particularly identified using the graph index 204. A plurality of performance lines 206 indicate excellent output error across a wide temperature range (e.g., −40° C. to 140° C.). The subject encapsulant performed very well without failure or significant hysteresis unlike prior art encapsulants. The formulation of FIG. 2 consists of high viscosity PFPE oil which contains a k-type or other branched molecule with an AMU>7000, and a blend of hydrophobic and hydrophilic silica which is approximately 5% silica by weight. This formulation is suitable for use up to at least 250° C., which is a wider temperature range compared to other composition formulations such as PFPE gel. As can be seen, this formulation provides excellent performance and the low temperature performance is particularly improved.

Vehicular testing of the subject encapsulant formulation over a MEMS sensor was conducted. Prior art gels performed poorly after driving 20,000 km. The subject encapsulants advantageously maintain integrity in such real world conditions. The subject encapsulants were acid tested consisting of soaking the MEMS sensor in an acid of pH 1.6 at 85° C. for 480 hours. The encapsulations did not degrade or swell. Further, the encapsulations did not exhibit bubbling or other characteristics of failure. The encapsulation was also tested with an acid drop test of 40 cycles in the same solution. Again, the encapsulation did not degrade, bubble or swell in an unacceptable manner. As a result, the subject encapsulations provide an effective acid barrier that is able to protect non-noble materials like aluminum sense elements.

Figure 3:
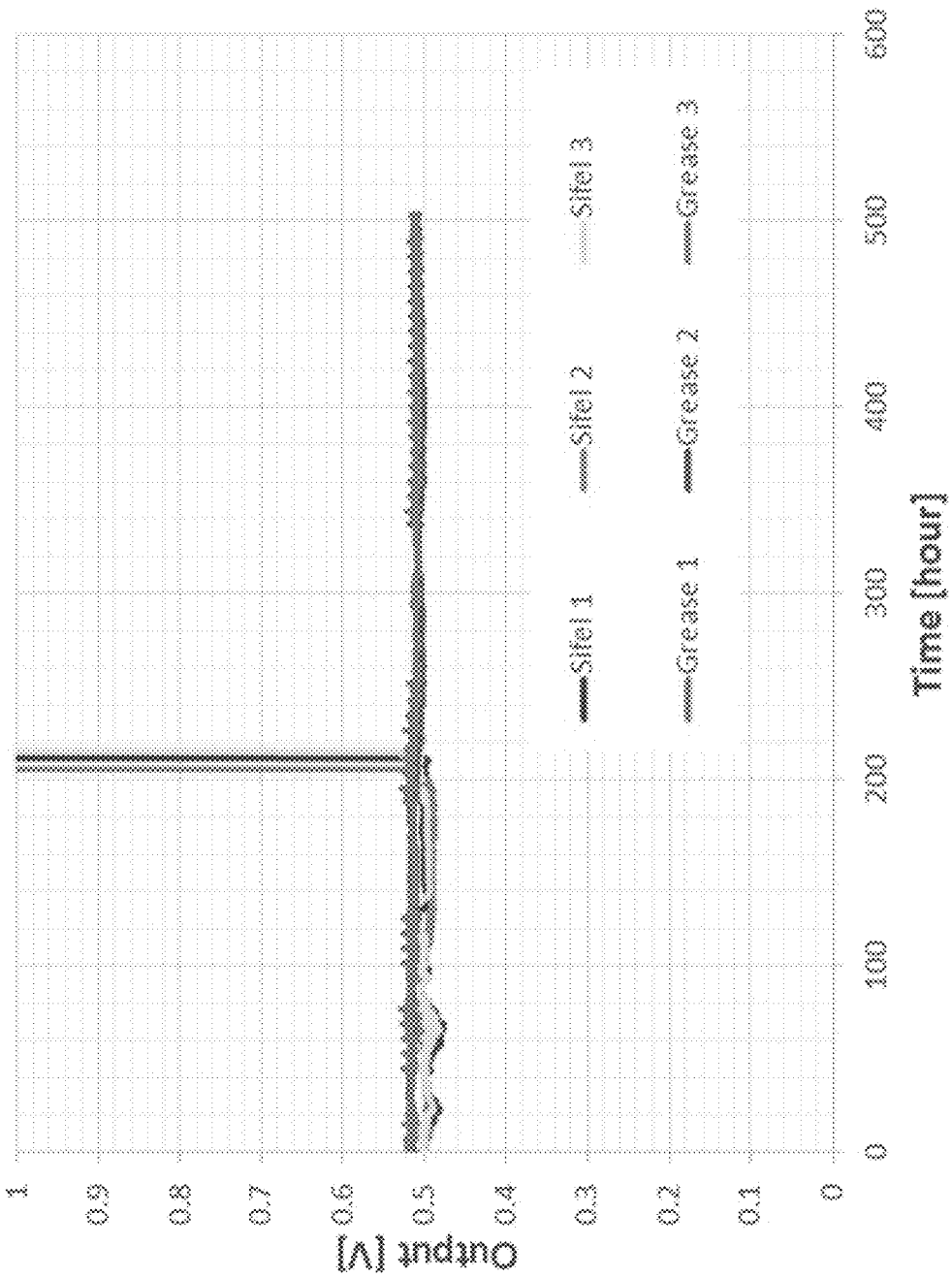
FIG. 3 is a graph of MEMS operation versus time during acid drop testing of MEMS sensors with various encapsulation including encapsulation in accordance with the subject disclosure.

Referring now to FIG. 3, a graph of MEMS operation versus time during acid drop testing of MEMS sensors with various encapsulation including encapsulation in accordance with the subject disclosure is shown. For the MEMS sensors having encapsulation in accordance with the subject technology, the performance was as designed by yielding consistent readings during the acid drop testing as shown by lines 310. In contrast, MEMS sensors having prior art encapsulation failed as shown by lines 312. The output in [V] correlates to the pressure. The pressure stays constant during the test, so any deviation of the output is caused by acid (electrical shorts or corrosion of contacts). Without being limited to any particular theory, the acid caused the prior art gel composition to swell and, in turn, the wire bonds fail electrically (e.g., shunt conductance). In another embodiment, a MEMS sensor with the subject encapsulant applied but having the wire bonds exposed was also tested. Although the performance was improved over the prior art, the performance was not as good as when the wire bonds were also covered. It is also noted that, upon inspection, the encapsulations in accordance with the subject technology maintained integrity in an improved manner over the prior art. In the acid drop test, the grease formulation is YR1800 and a blend of hydrophobic and hydrophilic silica. The ratio of hydrophobic:hydrophilic silica is approximately 50:50.

Vibration testing was also performed. The vibration testing consisted of applying a 50G sine wave for 80 hours in one direction. Upon inspection, the encapsulations in accordance with the subject technology maintained integrity. The subject encapsulations were also subjected to temperature and pressure testing.

For temperature testing, the encapsulation was tested under the conditions of dwelling at 150° C. for 480 hours and 150° C. for 3000 hours. Temperature shock testing of 1,000 cycles from −40° C. to 140° C. was also tested. For pressure testing, the encapsulation was tested under the conditions of dwelling at 10 barG for 24 hours. Again upon inspection, the encapsulations in accordance with the subject technology maintained integrity better than the prior art.

Figure 4:
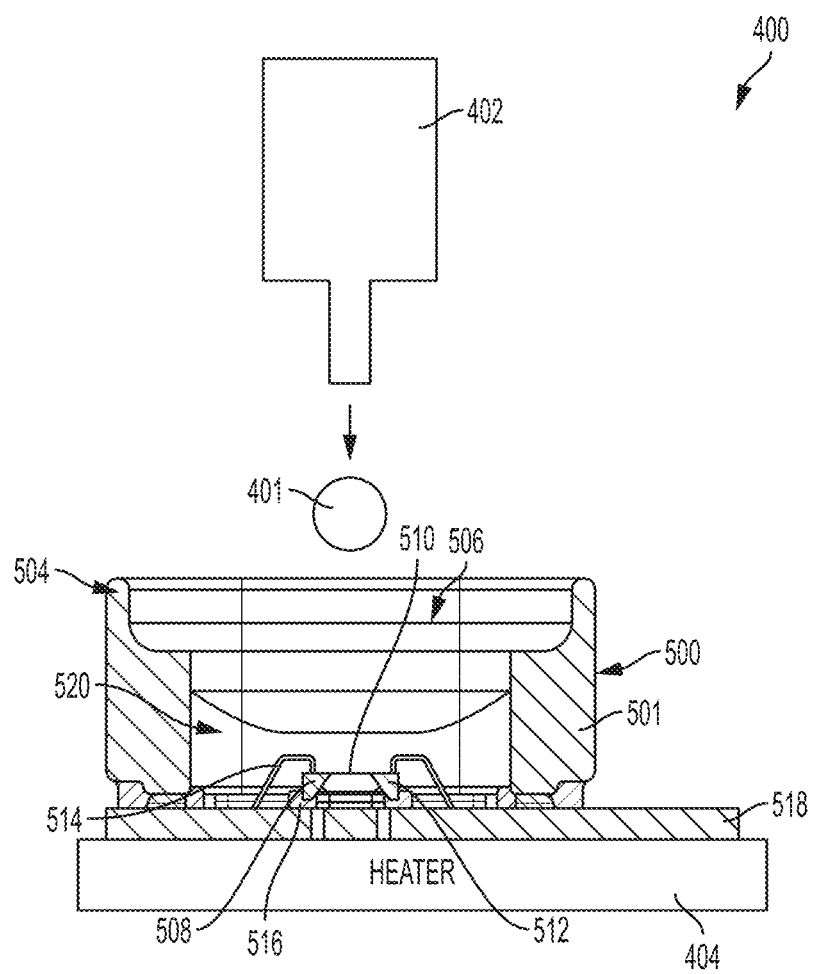
FIG. 4 is a somewhat schematic illustration of an apparatus for acid drop testing a MEMS sensor or like device in accordance with the subject technology.

Referring now to FIG. 4, a somewhat schematic illustration of an ADT apparatus 400 for acid drop testing (ADT) of a MEMS sensor 500 in accordance with the subject technology is shown. The device to be tested can be any such as shown above, as shown in U.S. Pat. No. 6,401,545 issued to Monk et al. on Jun. 11, 2002, or like devices now known or later developed. The MEMS sensor 500 has a housing 501 forming an encapsulant dam 504, which creates a cavity region 506 above the active assembly 508. The active assembly 508 includes a diaphragm 510 integrated on a sensor die 512 with the cavity region 506. Wire bonds 514 electrically connect the sensor die 512. An adhesive 516 secures the sensor die 512 to a substrate 518. Encapsulant 520, as disclosed herein, fills a portion of the cavity region 506 so that the wire bonds 514 are covered.

The ADT apparatus 400 includes an acid dispenser 402 capable of releasing an acid droplet 410 onto the MEMS sensor 500 as desired. The acid droplet 410 is a synthetic exhaust gas condensate to simulate real-world conditions. The ADT apparatus 400 measures an amount of evaporation of the acid droplet 410 in order to determine when to release another acid droplet. In one embodiment, the next acid droplet 410 is released upon evaporation of the previous acid droplet. Alternatively, a new droplet 410 is dispensed when the previous one is nearly evaporated so that the MEMS sensor 400 is maintained in a wet condition.

The ADT apparatus 400 also includes a heater assembly 404 coupled to the substrate 518 for controlling the encapsulant temperature to simulate various real-world operating temperatures. In one embodiment, the heater assembly 404 creates a cycle with the encapsulant temperature at 45° C. for seven hours then at 78° C. for one hour. The cycle can be repeated any number of times, for example for 30 cycles (240 hours) while the acid droplets 410 are dispensed.

Encapsulant in accordance with the subject technology and prior art gels were tested using the ADT apparatus 400 for 40 cycles as described above. The prior art gels swelled and bubbled undesirably. However, encapsulant in accordance with the subject technology had no degradation, bubbles or swelling. As a result, the subject encapsulant is particularly well-suited to protecting non-noble aluminum dies and thinner layers of encapsulant can be utilized.

Figure 5:
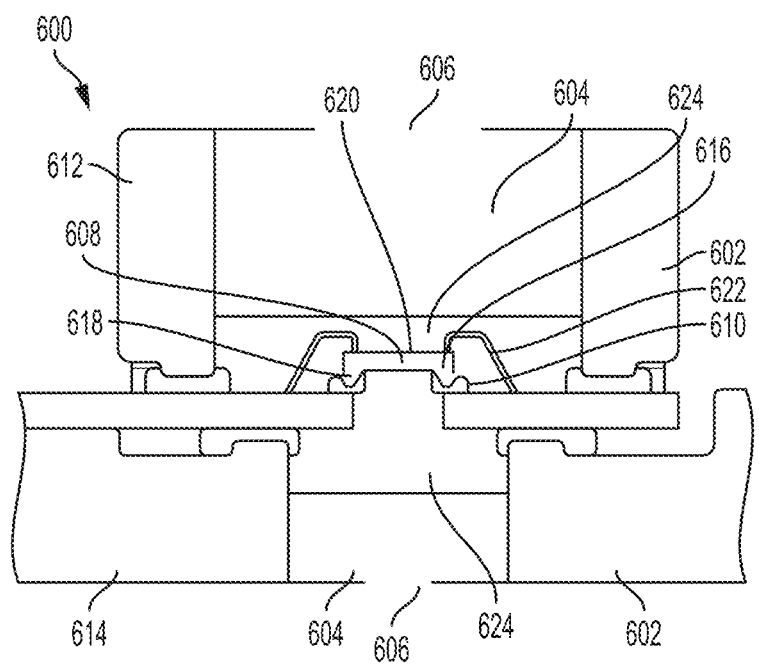
FIG. 5 is a schematic diagram of another MEMS sensor in accordance with the subject disclosure.

Referring now to FIG. 5, a schematic diagram of another MEMS sensor 600 in accordance with the subject disclosure is shown. As will be appreciated by those of ordinary skill in the pertinent art, the MEMS sensor 600 utilizes similar principles to the MEMS sensor 100 described above. Accordingly, like reference numerals preceded by the numeral "5" instead of the numeral "1", are used to indicate like elements. The following description is directed to the differences.

A primary difference of the MEMS sensor 600 is that both sides of the sensing element 616 are exposed to the sensed medium. The lower half 614 also defines an inlet 606 for allowing the medium into the housing 602. As such, the encapsulant 624 is applied on the top and bottom of the membrane 608 to protect the sensing element 616 and wire bonds 622.

Other embodiments may include sensors having multiple sides, each of which has an encapsulant applied thereto. Additionally, the encapsulant coating may several layers, each layer having different qualities. It will be appreciated by those of ordinary skill in the pertinent art that the functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., membranes, housings, mounts, wire bonds and the like) shown as distinct for purposes of illustration may be incorporated within other functional elements in a particular implementation.

Further, although the subject technology has been described with respect to the field of protecting sensor wires, it is envisioned that the subject technology would be equally applicable to other fields and applications. As one of ordinary skill in the art would understand from review of the subject disclosure, the disclosed encapsulant or grease provides moisture and acid protection for pressure sensors while not degrading the sensor accuracy. Due to the properties of the subject encapsulants of: high thermal stability; non-flammable; excellent chemical inertness; good dielectric properties; good compatibility with materials; low out gassing; and stability in radioactive and radiation environments, the subject technology is suitable for encapsulation of sensors and electronics in other applications such as aerospace and medical equipment. Further, the subject encapsulants are translucent so a light sensing application which needs moisture and corrosion protection is also envisioned. Similarly, the thermal conductivity also makes the subject technology suitable as an encapsulation of a temperature sense element and wires thereof. In one embodiment, the thermal conductivity is in the order of approximately 0.07 W/m° C. at 25° C.

All numerical ranges referred to herein include each and every number or number combination contained within such range. As an example, 70-100 includes 71, 72, 73, 74, 75, 76, 77, 78, 79, 80, 81 etc. Similarly, each list of numbers includes each and every number or number combination contained within such list. As an example, up to 50%, preferably 40%, 30%, 20% or 10% includes 1%, 2%, 3%, 4%, 5%, 6%, 7%, 8%, 9%, 10%, 11% etc.

All patents, patent applications and other references disclosed herein are hereby expressly incorporated in their entireties by reference. While the subject technology has been described with respect to preferred embodiments, those skilled in the art will readily appreciate that various changes and/or modifications can be made to the subject technology without departing from the spirit or scope of the invention as defined by the appended claims. For example, each claim may depend from any or all claims in a multiple dependent manner even though such has not been originally claimed.

What is claimed is:

1. A MEMS sensor comprising:
   a housing defining an interior and an inlet in fluid communication with an environment for sensing;
   a sensing die coupled to the housing for generating a signal based on the environment; and
   an encapsulant applied to the sensing die for protecting the sensing die without interfering with the operation of the sensing die, characterized in that the encapsulant is a composition comprising a non-crosslinked dispersion of an organic substance and an inorganic silica thickener;
   wherein the sensor is a pressure sensor.

2. The MEMS sensor as recited in claim 1, wherein the encapsulant is at least 2% by weight of the silica thickener.

3. The MEMS sensor as recited in claim 1, wherein the encapsulant is a silica thickened perfluoropolyether (PFPE) oil.

4. The MEMS sensor as recited in claim 1, wherein the encapsulant includes a K-type PFPE oil and a blend of hydrophobic and hydrophilic silica which is at least 2% silica by weight.

5. The MEMS sensor as recited in claim 4, wherein the blend of hydrophobic and hydrophilic silica is present in a ratio of about 50:50.

6. The MEMS sensor as recited in claim 1, wherein the non-crosslinked organic substance is a composition comprising a compound of Formula I, Formula II, or a blend of Formula I and Formula II.

7. The MEMS sensor as recited in claim 6, wherein the composition is a blend of Formula I and Formula II comprising up to 40 wt % of Formula II.

8. The MEMS sensor as recited in claim 6, wherein the composition is a compound of Formula I having an AMU of greater than 7,000 or the composition is a compound of Formula II having an AMU of greater than 18,000.

9. The MEMS sensor as recited in claim 8, wherein Formula II has an AMU of greater than 21,000.

10. The MEMS sensor as recited in claim 1, wherein the silica thickener is a blend of hydrophobic and hydrophilic silica.

11. The MEMS sensor as recited in claim 10, wherein the blend of hydrophobic and hydrophilic silica is 70-100% hydrophobic silica.

12. A method for making a MEMS sensor comprising the steps of:

providing a housing defining an interior and an inlet in fluid communication with an environment for sensing;

providing a sensing die coupled to the housing for generating a signal based on the environment;

applying an encapsulant to the sensing die for protecting the sensing die without interfering with the operation of the sensing die, characterized in that the encapsulant is a composition comprising a non-crosslinked dispersion of an organic substance and an inorganic silica thickener, wherein the sensor is a pressure sensor.

13. The method as recited in claim 12, further comprising the step of fabricating the encapsulant by thickening a perfluoropolyether (PFPE) oil to a semisolid by using microscopic particles of silica.

14. The method as recited in claim 12, wherein the encapsulant is at least 2% by weight of the silica thickener.

15. The method as recited in claim 12, wherein the encapsulant is a silica thickened perfluoropolyether (PFPE) oil.

16. The method as recited in claim 12, wherein the encapsulant includes a K-type PFPE oil and a blend of hydrophobic and hydrophilic silica which is at least 2% silica by weight.

* * * * *